United States Patent [19]

Bethurum

[11] Patent Number: 5,689,405
[45] Date of Patent: Nov. 18, 1997

[54] IC CARD REAR BOARD SUPPORT

[75] Inventor: Gary Cain Bethurum, Laguna Niguel, Calif.

[73] Assignee: ITT Corporation, New York, N.Y.

[21] Appl. No.: 719,856

[22] Filed: Sep. 25, 1996

[51] Int. Cl.$^6$ .................................................. H05K 1/14
[52] U.S. Cl. ........................ 361/737; 361/741; 361/756; 439/79; 439/328; 439/946
[58] Field of Search ................................ 361/725, 727, 361/728, 730, 736, 737, 741, 748, 749, 752, 756, 800, 802, 810, 816, 818, 797; 439/59, 79–80, 328, 633, 946, 569, 571

[56] References Cited

U.S. PATENT DOCUMENTS

| | | | |
|---|---|---|---|
| 3,216,580 | 11/1965 | Fricker, Jr. | 211/41 |
| 3,803,533 | 4/1974 | Taplin | 339/91 |
| 5,184,961 | 2/1993 | Ramirez et al. | 439/59 |
| 5,277,611 | 1/1994 | Berek et al. | 439/325 |
| 5,290,174 | 3/1994 | Woratyla et al. | 439/59 |
| 5,318,452 | 6/1994 | Brennian, Jr. et al. | 439/79 |
| 5,413,497 | 5/1995 | Lwee | 439/328 |
| 5,437,560 | 8/1995 | Mizuguchi | 439/326 |
| 5,477,421 | 12/1995 | Bethurum | 361/818 |
| 5,477,426 | 12/1995 | Bethurum | 361/737 |
| 5,481,434 | 1/1996 | Banakis, et al. | 361/756 |
| 5,494,451 | 2/1996 | Bowers | 439/328 |

FOREIGN PATENT DOCUMENTS

| | | |
|---|---|---|
| 0590429 | 9/1993 | European Pat. Off. . |
| WO9524020 | 3/1994 | WIPO . |

OTHER PUBLICATIONS

ITT Cannon Catalog Entitled "StarCard II PCMCIA I/O Card Kit"; Oct. 1994.
Method Electronics, Inc. Catalog Entitled "PC Card Products"; Undated.

*Primary Examiner*—Leo P. Picard
*Assistant Examiner*—Anthony Dinkins
*Attorney, Agent, or Firm*—Freilich Hornbaker Rosen

[57] ABSTRACT

A frameless IC card is provided, with a rear board support (26) to hold the rear of a circuit board, wherein a single design of rear board support can hold circuit board rear ends (24A, 24B, 24C) at a selected one of a plurality of different heights. The rear board support has top and bottom horizontal flanges (52, 54) and a plurality of vertical ribs (61–66) merging with the flanges, with the ribs being laterally spaced apart. A first set of vertical ribs (61, 62) has horizontal grooves (71, 72) of a first height extending into its front edge, with the grooves being about as thick as the circuit board, to closely receive the rear (24A) of a circuit board and thereby vertically position it. The rear board support includes a second set of ribs (63, 64) with horizontal grooves (73, 74) lying at a different height, to thereby hold a circuit board rear end (24B) at a different height, thereby enabling the same rear board support to hold circuit boards at selected heights. The rear of the circuit board has slots (83–86, 112–113, 115–116, 121–124) that receive ribs that do not closely position the height of the circuit board. The rear board support has forwardly-projecting latch legs (130, 132) that fit into circuit board cutouts (140, 142), so shoulders (144, 146) on the legs and on the cutouts engage to prevent the circuit board from pulling forwardly (F) out of the rear board support.

17 Claims, 5 Drawing Sheets

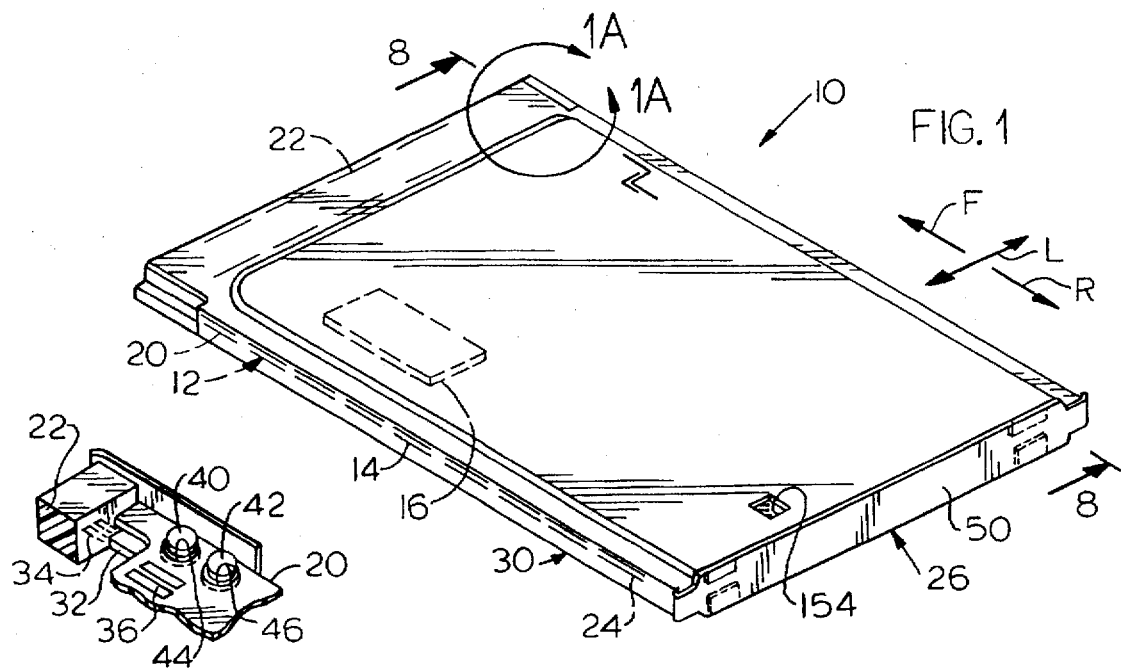
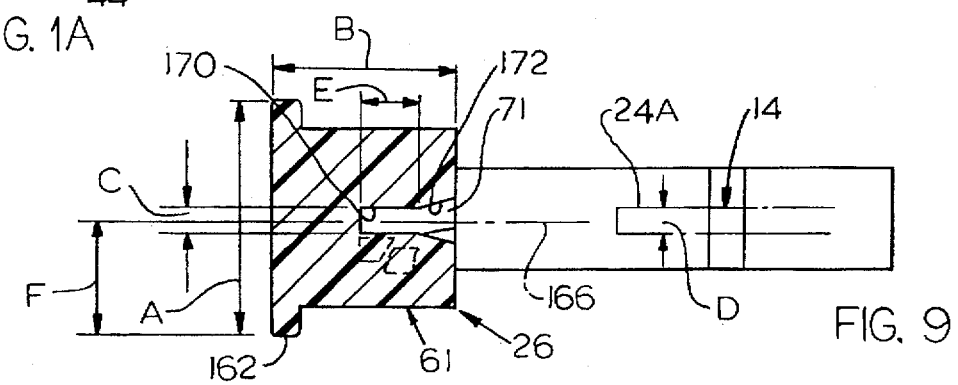
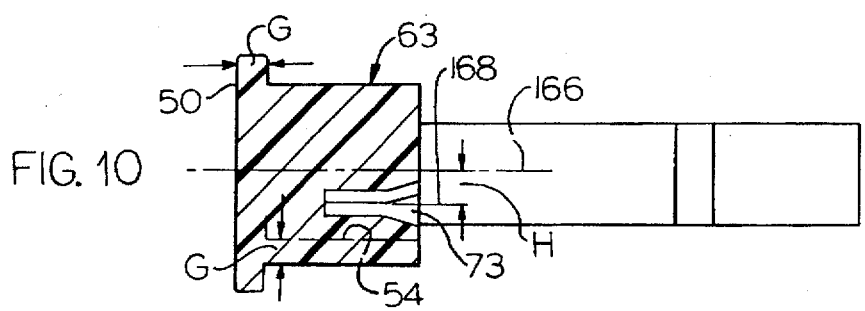
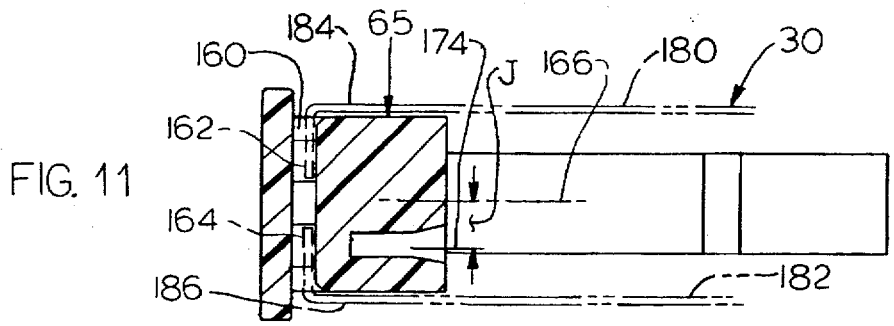

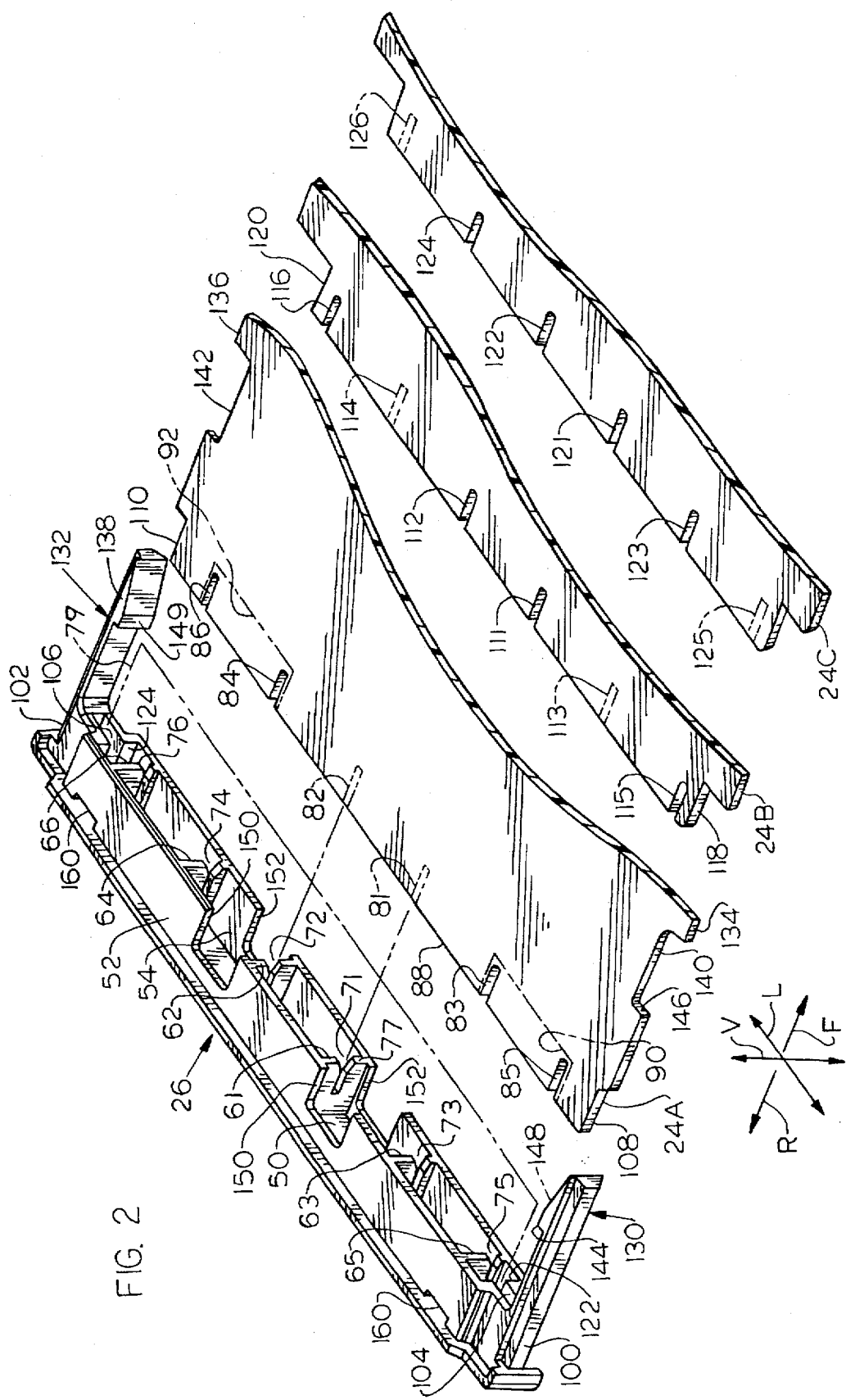

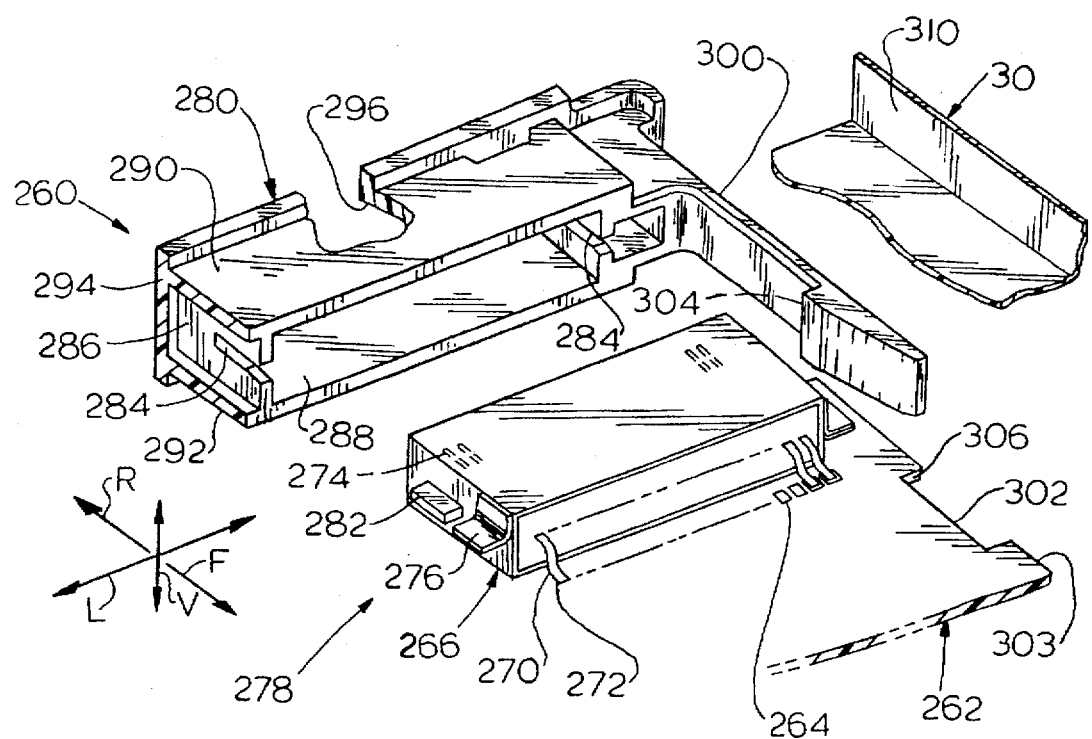
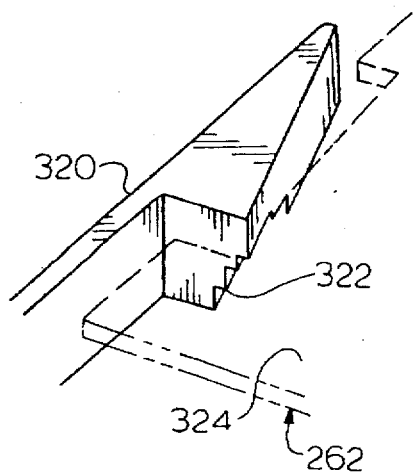

IC CARD REAR BOARD SUPPORT

BACKGROUND OF THE INVENTION

IC cards, which are often memory cards, include a circuit board with electrical components, a front connector that can mate with a connector of an electronic device when the IC card is inserted into a slot, and a sheet metal cover that surrounds the circuit board. U.S. Pat. Nos. 5,207,586 and 5,244,397 show IC cards with a molded plastic frame that ties all the parts together. My earlier U.S. Pat. No. 5,477,426 shows a frameless IC card, which eliminates a molded plastic frame by directly mounting the front and rear of the circuit board on front and rear connectors, and with the sheet metal cover mounted on the connectors. The front connector has opposite sides forming support parts, the support parts having upstanding pegs that are received in holes in the circuit board. Where a row of contacts is required at the rear of the IC card, a similar arrangement is used to support the rear of the circuit board on the rear connector.

In many cases, the rear of the IC card does not include an I/O (input/output) connector, but is merely closed. In such a case, for a frameless IC card, it would be desirable if the rear connector or rear board support, provided very close support of the rear of the circuit board.

Under JEIDA standards, each IC card has a card length of 85.6 mm, a card width of 54 mm, and a thickness that is 3.3 mm (for type I), 5 mm (for type II) and 10.5 (for type III). The type II card is the most common. Because of the small height available within the card, it is often desirable to allow the designer to mount the circuit board at a selected one of different heights, to accommodate components of different thicknesses. My earlier U.S. Pat. No. 5,477,426 shows each board support with its peg having a plurality of steps. A circuit board can be drilled with a hole of a particular diameter to accommodate a particular step and thereby lie at a selected height. Means such as adhesive are required to hold down the circuit board to the support parts. It would be desirable if the rear board support for an IC card without rear connector, could hold the rear of the circuit at a selected one of a plurality of different heights in a simple and secure manner, to prevent both upward and downward board movement.

SUMMARY OF THE INVENTION

In accordance with one embodiment of the present invention, an IC card is provided, especially one of the frameless type, with a rear board support that is of simple construction and that securely holds the rear of the circuit board, preferably at a selected one of a plurality of different heights. The rear board support has top and bottom horizontal flanges with rear ends that merge with a vertical rear wall. A plurality of vertical ribs extend forwardly of the rear wall and extend vertically between the top and bottom flanges. A first set of vertical ribs each has a horizontal groove that is about as thick as the circuit board, to closely receive the circuit board and support it at least against upward and downward movement.

The plurality of vertical ribs includes a second set of ribs with horizontal grooves lying at a different height than the horizontal grooves of the first set of ribs. This allows the circuit board to be mounted at a selected height, by inserting it into those grooves of the selected height. The rear of the circuit board has slots that receive those ribs that do not have grooves of the selected height.

The rear board support has forwardly-projecting latch legs at its opposite sides, which have lugs that fit into cutouts at the side edges of the circuit board. Shoulders at the legs and cutouts prevent the circuit board from pulling forwardly out of the rear board support. The latch legs are devoid of horizontal grooves that would closely receive the circuit board, so the latch legs can engage circuit boards lying at different heights. The latch legs can be useful even for an IC card wherein a multi-contact rear connector is fastened to the rear of the circuit board and slides rearwardly into a specially designed rear board support, to prevent forward pullout of the connector.

The novel features of the invention are set forth with particularity in the appended claims. The invention will be best understood from the following description when read in conjunction with the accompanying drawings.

BRIEF DESCRIPTION OF THE DRAWINGS

FIG. 1 is a rear isometric view of an IC card constructed in accordance with one embodiment of the present invention.

FIG. 1A is a partial isometric view of the area 1A—1A of FIG. 1, with the cover removed.

FIG. 2 is an exploded isometric view showing the rear board support of the IC card of FIG. 1, and showing the rear portions of three separate circuit boards, each constructed to mount on the same rear board support, but at a different selected height thereon.

FIG. 9 is a sectional view taken on line 9—9 of FIG. 5.

FIG. 10 is a sectional view taken on line 10—10 of FIG. 5.

FIG. 11 is a sectional view taken on line 11—11 of FIG. 5.

FIG. 13 is a partial exploded isometric view of an IC card of another embodiment of the invention.

FIG. 14 is an isometric view of a latch leg of another embodiment of the invention.

DESCRIPTION OF THE PREFERRED EMBODIMENTS

Figure 3:
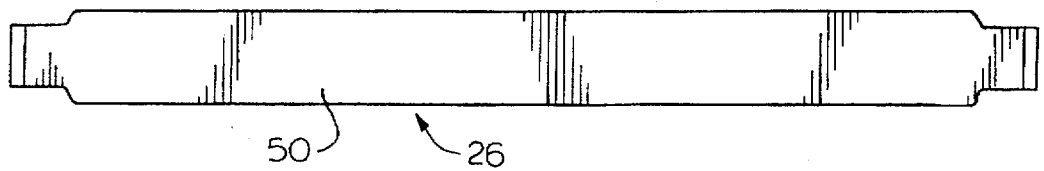
FIG. 3 is a rear elevation view of the rear board support of FIG. 2.
Figure 4:
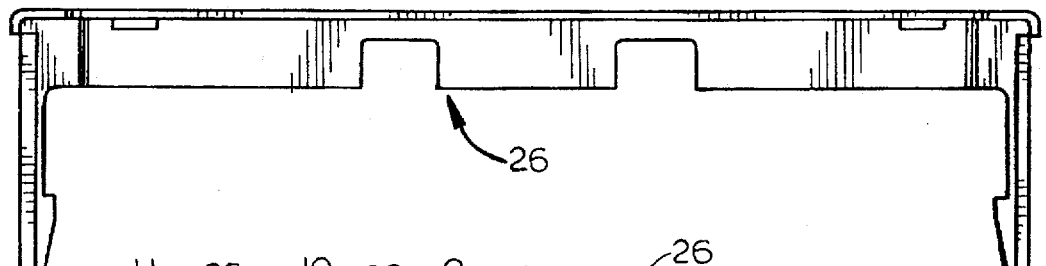
FIG. 4 is a plan view of the rear board support of FIG. 3.
Figure 5:
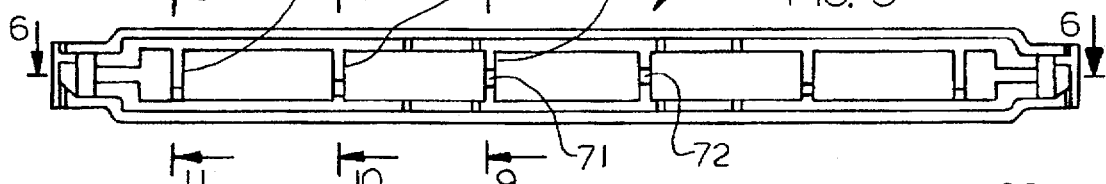
FIG. 5 is a front elevation view of the rear board support of FIG. 4.

FIG. 1 illustrates a frameless IC card 10 of the present invention, which includes a circuit board assembly 12 comprising a circuit board 14 and electronic components 16 thereon such as integrated circuits. The board has a front end 20 connected to a front connector 22 which has sixty-eight socket contacts arranged in two rows. The rear end 24 of the circuit board is mounted on an end cap or rear board support 26 of the present invention. The circuit board has a sheet metal cover 30 with upper and lower cover portions that lie respectively above and below most of the area of the circuit board. The particular IC card 10 does not have any connector at its rear end for the input and output of data, so the rear board support 26 does not have a row of contacts.

FIG. 1A shows the way in which the front end 20 of the circuit board is mounted on the front connector 22. The front connector has support parts 32 at opposite sides of a laterally-extending row of contacts 34 that engage a laterally-extending row of contact pads 36 on the circuit board. Each support part includes a pair of upward projections 40, 42 in the form of pegs that are received in drilled holes 44, 46 in the front end of the circuit board. Each peg has three steps, and the diameter of the circuit board holes 44, 46 determine the height at which the front end of the circuit board is mounted. The circuit board can be held down by adhesive, by downward projections mounted on the upper half of the cover, or by other means.

FIG. 2 shows details of the rear board support 26 and of the rear ends 24A, 24B, and 24C of three types of circuit boards. The rear board support 26 is a single injection molded piece, with a rear wall 50 that extends in a vertical plane, upper and lower flanges 52, 54 that extend in horizontal planes, and a plurality of vertically-extending ribs 61–66 that each extends in a vertical plane and that each merges with the rear wall 50 and with the upper and lower flanges 52, 54. The ribs are laterally spaced apart, in the lateral direction L, which is perpendicular to the forward and rearward directions F, R and to the vertical direction V. Each of the vertical ribs has a horizontally-extending groove, with a first set of ribs 61, 62 having grooves 71, 72 extending into the front edge 77 of the ribs. The rear portion or end 20A of board 24A, is designed to fit into the grooves 71, 72, with areas 81, 82 of the board rear end 24A indicated in phantom lines to indicate the locations on the board that are received in the grooves. The grooves 71, 72 are vertically aligned, in that they are spaced the same distance from an imaginary horizontal centerplane 79 of the rear board support.

The board rear end is formed with slots at 83–86 extending into the extreme rear end 88 of the board. Each slot 83–86 receives a portion of a corresponding one of the ribs 63–66, when the board areas 81, 82 are received in the rib slots 71, 72. The grooves 71, 72 have rear portions (rearward of their tapered entrances) that are substantially as thick as the thickness of the circuit board, to closely position the circuit board rear end and hold it against upward or downward movement. The board slots 83–86 are provided merely to allow the rear of the board to be pushed completely into the first set of grooves without interference from the other vertical ribs 63–66. It would be possible to form the rear end of the circuit board with wide slots indicated at 90, 92, although applicant prefers to form the narrower slots shown. For the particular circuit board rear end 24A, which may be the most commonly used, the opposite sides 100, 102 of the rear board support is provided with a pair of horizontal grooves 104, 106 that receive opposite sides 108, 110 of the board. The opposite sides of the grooves 104, 106 can be useful to fix the lateral position of the rear of the board. As can be seen, the first set of grooves 71, 72 lie at the middle of the height of the support, and hold the board at the middle of the height.

FIG. 2 also shows a second circuit board with a rear portion 24B that is designed to lie at a slightly lower position than the board 24A. This is accomplished by constructing the board rear end 24B so areas 113, 114 thereof are received in a second set of grooves 73, 74 which lie at a slightly lower height than the first set of grooves 71, 72. The rear board portion 24B has slots 111, 112, 115, 116 that receive the ribs 61, 62, 65, and 66. The opposite sides 118, 120 of the second rear board portion 24B are designed to lie closely adjacent to opposite walls 122, 124 of the rear board support. The wider spacing of the areas 113, 114 of the board rear portion provide greater stability, so that grooves at 104, 106 are not as important in stabilizing the rear of the board.

FIG. 2 also shows a third circuit board rear portion 24C, which has areas 125, 126 that are designed to be received in grooves 75, 76 of ribs 65, 66 of the rear board support. Slots 121–124 receive the vertical ribs 61–64 of the rear board support.

The rear board support 26 includes latch arms 130, 132 that extend forwardly from opposite sides of the rear board support. When a board rear end such as 24A is slid rearwardly, it rides over the opposite edges 134, 136 of the board until lugs or projections 138 at the front ends of the legs snap into cutouts 140, 142 in the board. Then, rearwardly-facing shoulders 144 on the lugs can abut forwardly-facing shoulders 146 at the rear ends of the cutouts, to prevent forward withdrawal of the board from the rear board support. The latch legs have laterally inner surfaces 148, 149 that are free of grooves to easily latch to boards of any height.

An examination of the rear board support 26 shows that the upper and lower flanges have cutouts at 150, 152 for receiving locating depressions formed in the sheet metal cover, as shown at 154 in FIG. 1. The flanges also have slits 160 for receiving downwardly-extending tabs formed at an end of the cover, such as is shown in FIG. 11 which shows the tabs 162, 164 projecting into the slits 160. FIG. 11 also shows upper and lower portions 180, 182 of the cover 30, and ends 184, 186 of the cover portions that are directly supported (with the tabs) on the rear board support.

Applicant has constructed a rear board support of the type illustrated, for holding circuit boards at three different heights. FIG. 9 shows a support constructed by applicant, which has an overall height A of 186 mils (one mil equals one-thousandth inch), or 4.72 mm (millimeters). Except for the latch arms, the support has a length B of 146 mils (3.72 mm). The groove 71 has a rear portion 170 lying rearward of its tapered entrance 172. The groove at 170 has a height C of 21 mils (0.53 mm) while the circuit board 14 has a thickness D of 18 mils (0.46 mm) plus or minus two mils (0.05 mm). As a result, the circuit board is very closely received in the groove 71, so it cannot "rattle" in the groove. The groove length E of minimum height C, is 53 mils (1.3 mm). The center of the height of the groove lies on a horizontal centerplane 166 that is spaced a distance F of 93 mils (2.4 mm) from the bottom of the rear board support at 162. Therefore, the groove 71 is spaced a distance of zero from the centerplane.

FIG. 10 shows a rib 63 whose groove 73 has a groove plane 168 that is spaced from the centerplane 166 by a distance H of 23 mils (0.58 mm). The top and bottom flanges 52, 54 and the rear wall 50 each have a thickness G of 21 mils (0.53 mm). FIG. 11 shows a rib 65 with a groove plane 174 spaced a distance J of 33 mils (0.84 mm) from the centerplane 166.

Figure 6:
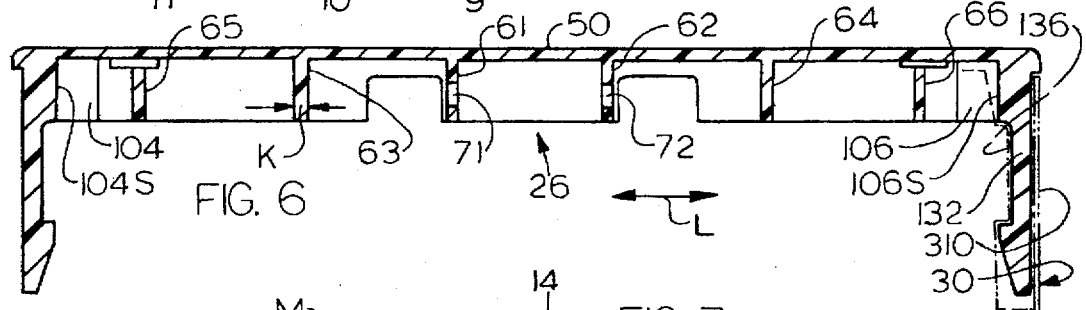
FIG. 6 is a sectional view of the rear board support of FIG. 5, taken on line 6—6 thereof.
Figure 7:
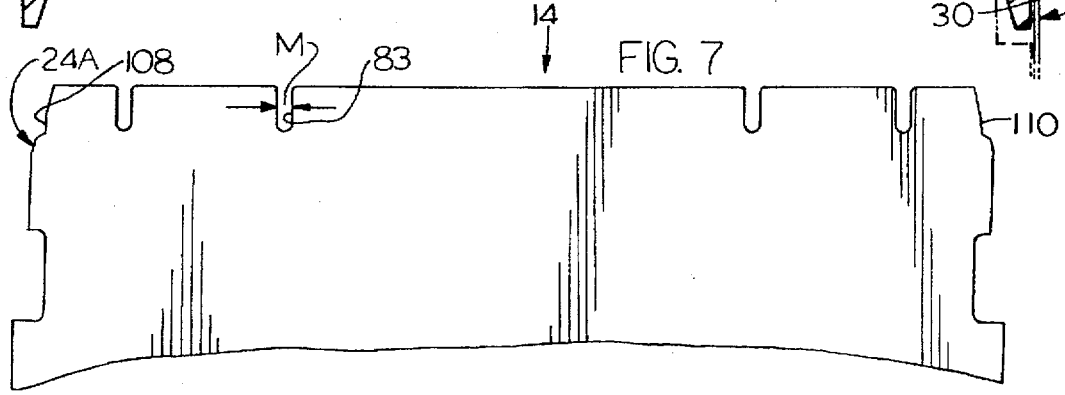
FIG. 7 is a partial plan view, showing the rear portion of the circuit board of FIG. 1.
Figure 8:
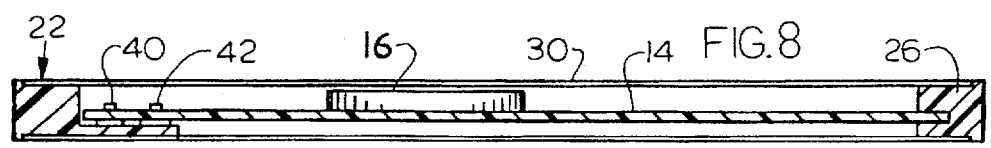
FIG. 8 is a view taken on line 8—8 of FIG. 1.

FIG. 6 indicates the lateral width K of each rib such as 63, which is 20 mils (0.5 mm) for the above-mentioned connector that applicant constructed. FIG. 7 indicates the width M of each circuit board slot such as 83, with M being equal to 31 mils (0.79 mm). The much larger width M of each slot than the width K of each rib, avoids interference of the circuit board with each rib that is received in a slot, despite manufacturing tolerances. In the case of FIG. 7, the lateral position of the circuit board is determined by engagement of its opposite sides 108, 110 with the side surfaces 104s, 106s of grooves 104, 106 in the rear board support.

FIG. 6 shows that each latch leg such as 132 is laterally sandwiched between a side edge 136 of the circuit board and a largely vertical side 310 of the sheet metal cover 30. The sheet metal cover side 310 keeps the leg 132 pressed against the circuit board side edge to help hold the parts of the IC card together.

Figure 12:
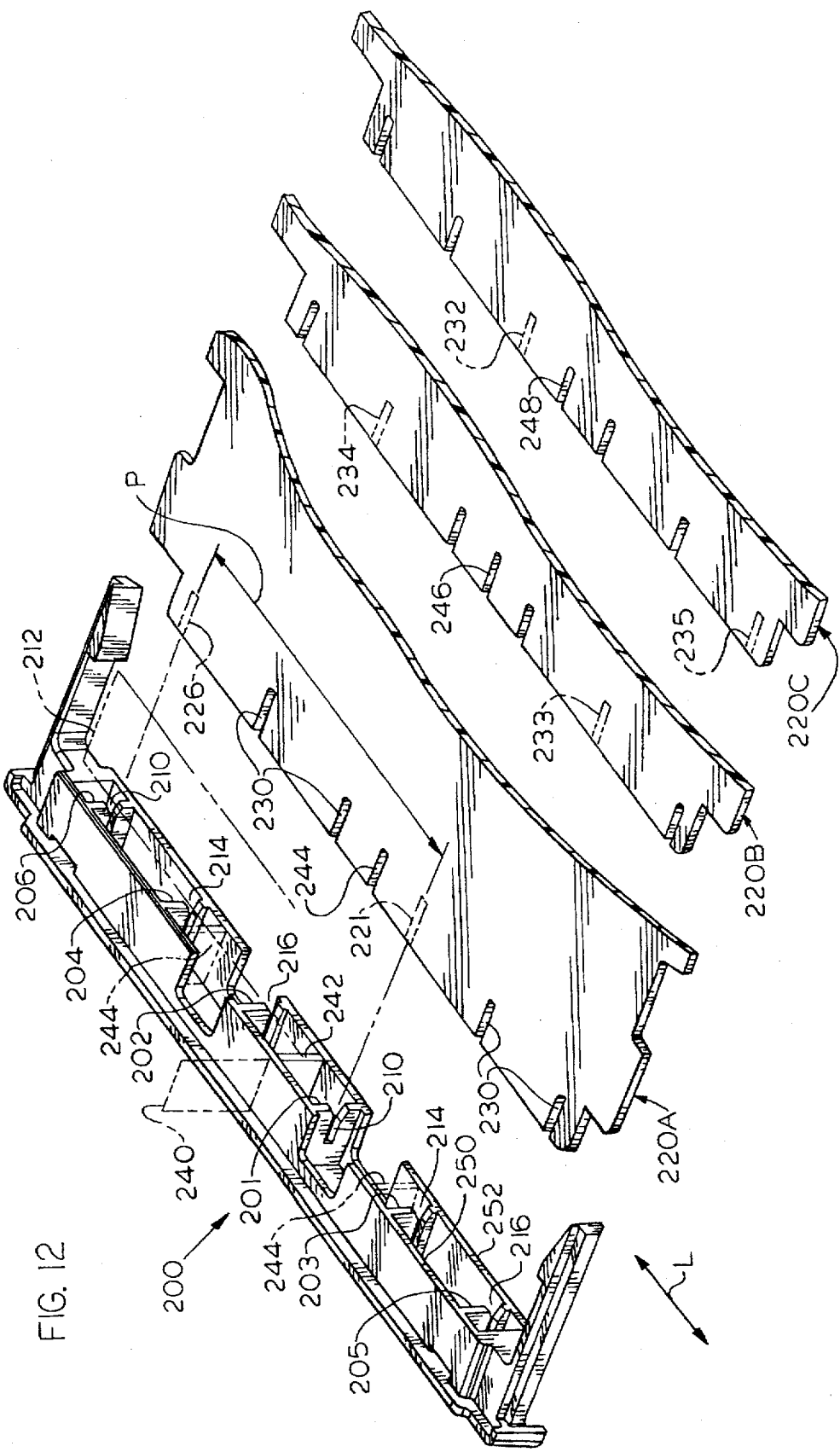
FIG. 12 is an exploded isometric view of a rear board support constructed in accordance with another embodiment of the invention, and showing the rear portions of three circuit boards that are each constructed for mounting at a different height on the rear board support.

FIG. 12 illustrates another embodiment of a rear board support 200 which is similar to that shown at 26 in FIG. 2, except that it has ribs 201–206 arranged in different pairs. The widely spaced ribs 201,206 have grooves 210 on or closest to the horizontal centerplane 212 of the rear board support. Ribs 203, 204 have the next lower grooves 214, while ribs 205, 202 have the lowest grooves 216. A first circuit board rear end 220A has areas 221,226 which are closely receive in grooves of the ribs 201 and 206. As a result there is a large lateral spacing P between the areas 221,226 of the circuit board that are held by the rear board support 200. The board rear portion includes slots 230 that receive the ribs 202, 203, 204 and 205.

Another circuit board rear end 220B has widely spaced areas 233, 234 that are closely received in grooves 214 of the ribs 203, 204. These areas 233, 234 are also widely spaced by a distance about equal to the distance P. The third circuit board 220C has areas 232, 235 for reception in grooves 216 of the ribs 202, 205. Thus, this arrangement results in each of the three types of circuit boards having rear ends that are closely received at locations spaced a distance that is about one-half the entire width of the IC card. For greater spacing, the ribs on opposite sides of vertical centerplane 240 (which is normal the lateral direction L) can all be spaced far from the vertical centerplane.

The rear board support 200 is provided with a grooveless vertical rib 242, which is closely received in slots 244, 246, 248 in each of the circuit board rear ends 220A, 220B, and 220C. The purpose of the rib 242 is to more securely support the upper and lower flanges 250, 252, and to closely locate each of the circuit boards in a lateral direction L. To this end, each of the slots 244, 246, 248 at the centers of the circuit boards, are of about the same width as the rib 242 to closely receive it. Of course, instead of one rib 242 at the lateral center of the rear board support, it is possible to provide two (or more) grooveless ribs, as at 244.

It is noted that either of the boards 220A or 220C can be turned upside down to fit in grooves of a different set of ribs so the upside-down board is held at a different level.

It may be noted that the rear wall 50 (FIG. 6), the vertical ribs 61–66, and the top and bottom flanges 52, 54 each have about the same thickness of about 20 mils (the thickest of them has a thickness no more than 50% greater than that of the thinnest of them). This avoids sinking of any portion during injection molding, to provide a rear board support formed with high precision.

While the rear board support has been developed by applicant primarily for an IC card without a row of contacts at the rear, the invention can be used with an IC card having a rear row of contacts. FIG. 13 shows an example where an IC card 260 includes a circuit board 262 having a laterally-extending (L) row 264 of contact pads at its rear. A rear electrical connector 266 has a row of contacts 270, with contact tails 272 soldered to the contact pads, and with rear pin mating ends 274. The rear connector is fixed to the circuit board by tabs 276 that are soldered to solderable areas on the board. The combination of the circuit board 262 and the rear electrical connector 266 fixed thereto (and any other electrical components on the board) is referred to as a circuit board assembly 278.

The IC card includes a plastic molded rear board support 280 which directly engages the rear connector 266 to fix their relative vertical (V) positions. In the example, the rear connector has parts 262 that fit into horizontal grooves 284 in vertical ribs 286 of the rear board support. An alternative is for the rear connector to be held in a horizontal groove 288 formed between top and bottom flanges 290, 292 of the rear board support. Any or all horizontal grooves 284, 288 closely fix the relative vertical positions of the rear end cap to the circuit board assembly. The rear board support has a rear wall 294 with an access opening 296 for passing a plug to mate with the rear connector.

When the rear connector 266 is pushed rearwardly (R) into the rear board support 280, a pair of latch legs 300 snap into cutouts 302 at the side edges 303 of the circuit board 262. A rearwardly-facing shoulder 304 on each leg lies closely adjacent to a forwardly-facing shoulder 306 in each cutout, to prevent the forward (F) pullout of the circuit board assembly 278, from the rear board support 280. The latch legs lie closely between the board side edge 303 and vertical sides 310 of the sheet metal cover 30.

The rear connector 266 can be formed with tabs such as 276 lying at different heights, to hold the circuit board 262 at corresponding different heights with respect to the sheet metal cover 30 and rear board support 280. To enable the same rear board support 280 to be used with circuit boards lying at different heights, the latch legs such as 300 are devoid of grooves that would closely surround the circuit board side edges. FIG. 14 shows a latch leg 320 with steps 322 for engaging just the upper face 324 of a circuit board 262. The steps still allow the circuit board to lie at three different selected heights.

While terms such as "top" and "bottom" have been used to aid in illustrating the invention as illustrated, the IC card can be used in any orientation with respect to the Earth.

Thus, the invention provides an IC card and a rear board support thereof which is easily and accurately constructed to support the rear of a circuit board at a selected height. The rear board support has a plurality of vertically-extending ribs, with a first set of vertical ribs having grooves that closely receive areas of the circuit board to fix the height of the circuit board. A second group of vertical ribs have grooves at a different height, and the rear of the circuit board can be formed to be closely received in the second ribs and to have slots that receive the first ribs. A third set of vertical ribs has grooves at a still different height, and a third circuit board can be held by the third ribs and have slots that receive the first and second ribs. The ribs have about the same width as the top and bottom flanges and rear wall of the rear board support, with the ribs merging with the flanges and rear wall to support them. A pair of latch legs project forwardly from opposite sides of the rear board support and enter cutouts at side edges of the circuit board. This allows rearwardly-facing shoulders on the latch arms to engage forwardly-facing shoulders on the boards at the cutouts, to prevent forward pullout of the circuit board from the rear board support.

Although particular embodiments of the invention have been described and illustrated herein, it is recognized that modifications and variations may readily occur to those skilled in the art, and consequently, it is intended that the claims be interpreted to cover such modifications and equivalents.

What is claimed is:

1. An IC card which includes a circuit board having front and rear ends and a laterally-extending row of contact pads at its front end, front and rear board supports coupled respectively to said circuit board front and rear ends, wherein said front board support has at least one row of electrical contacts engaged with said row of contact pads, and a sheet metal cover having upper and lower portions lying respectively over and under said circuit board, said cover having front and rear portions coupled respectively to said front and rear board supports, wherein:

said rear board support has a rear wall, laterally spaced opposite sides, upper and lower flanges, and a plurality of laterally-spaced vertically-extending ribs lying forward of said rear wall and merging with said upper and lower flanges, said rear board support having an imaginary horizontal centerplane, and a first set of said ribs each having a first horizontally-extending groove that receives said board rear end and that is spaced a first predetermined distance from said centerplane.

2. The IC card described in claim 1 wherein:

said plurality of vertical ribs includes a second set of said ribs, with said circuit board rear end having a slot extending forwardly from a board extreme rear end, and with each rib of said second set of ribs received in one of said slots in said circuit board.

3. The IC card described in claim 2 wherein:

each vertical rib of said second set has a horizontal groove which lies below the level of the grooves in said ribs of said first set, whereby said rear board support can be used to hold circuit boards at different heights.

4. The IC card described in claim 1 wherein:

said rear wall, said upper and lower flanges, and said vertical ribs, each have about the same thickness.

5. The IC card described in claim 1 wherein:

said circuit board has opposite board side edges with cutouts therein and said sheet metal cover includes largely vertical cover sides lying laterally outside said board side edges;

said rear board support includes a pair of legs extending rearwardly from said opposite sides, with each leg having a lug projecting into one of said board side edge cutouts, and with each leg being laterally sandwiched between a board side edge and a corresponding vertical cover side.

6. A rear board support for use in an IC card to support the rear of a circuit board, comprising:

a rear wall having laterally-spaced opposite sides, top and bottom primarily horizontal flanges having rear ends merging with said rear wall, and a plurality of laterally-spaced vertical ribs extending forwardly of and merging with said rear wall and extending between and merging with said flanges, with said rear board support having a horizontal centerplane lying halfway between said top and bottom flanges, with each of said vertical ribs having a front edge, and with a first set of said ribs each having a horizontal groove extending into its front edge and spaced a first vertical distance from said horizontal centerplane.

7. The rear board support described in claim 6 wherein:

a second set of said vertical ribs, each has a groove extending into its front edge and spaced a second vertical distance from said horizontal centerplane, where said second distance is greater than said first distance.

8. The rear board support described in claim 7 wherein:

each of said set of ribs includes two laterally-spaced ribs; said board support has a vertical centerplane lying halfway between said opposite sides;

one rib (201) of said first set lies on a first side of said centerplane and is spaced a small first distance therefrom while a second rib (206) of said first set lies on a second side of said vertical centerplane and is spaced a larger second distance therefrom;

one rib (203) of said second set lies on said first side of said centerplane and is spaced a third distance therefrom which is greater than said first distance, while a second rib (204) of said second set lies on said second side of said vertical centerplane and is spaced a fourth distance therefrom which is smaller than said second distance.

9. The rear board support described in claim 6 wherein:

each of said sets of ribs includes two laterally-spaced ribs, with the two ribs of said first set being closely laterally spaced and lying on laterally opposite sides of said vertical centerplane, and with the two ribs of said second set lying on laterally opposite sides of said ribs of said first set;

said rear board support has laterally opposite side portions that each includes a horizontal groove which is of a height to receive a planar board which fits into the grooves of said first set of ribs.

10. The rear board support described in claim 6 wherein:

said top and bottom flanges each have a vertical thickness (G), said vertical ribs each having a lateral width (K), and said grooves each has a vertical height (C), with said thickness (G), said width (K) and said height (C) all being about equal.

11. The rear board support described in claim 6 wherein:

said rear board support has opposite board support sides and includes a pair of latch legs each projecting forwardly from one of said board support sides, with said latch legs each having a forward end forming a lug that projects laterally toward the opposite leg, with each lug forming a rearwardly-facing shoulder and with each lug forming a laterally inward surface for engaging a side edge of a circuit board, with said laterally inward surfaces being grooveless to enable their engagement with circuit boards lying at different heights.

12. A frameless IC card comprising:

a circuit board (14) having front and rear ends (20, 24), said board having a small thickness, a larger laterally-extending width, and a still longer length extending in front and rear directions;

front and rear board supports (22, 26) that each directly supports a corresponding end of said circuit board;

a sheet metal cover (30) that includes upper and lower cover portions lying respectively above and below said circuit board and front and rear cover portions that are directly supported on said front and rear board supports, respectively;

said rear board support having top and bottom flanges and a plurality of laterally-spaced vertical first ribs extending vertically between said flanges, with each of said first ribs having horizontally-aligned first grooves that each have a thickness about equal to the thickness of said board and with said circuit board rear end lying in said grooves.

13. The frameless IC card described in claim 12 wherein:

said rear board support has a horizontal centerplane and has a plurality of laterally-spaced vertical second ribs, with each of said second ribs having horizontally-aligned second grooves lying at a different distance from said horizontal centerplane than said first grooves.

14. An IC card system which includes at least two types of IC cards, wherein each type of card includes a circuit board having front and rear ends, front and rear board supports connected respectively to said board front and rear ends, and a sheet metal cover having upper and lower cover portions lying respectively over and under said circuit board and front and rear cover ends each coupled to one of said board supports, wherein:

for each of said types of IC cards, said rear board support has a horizontal centerplane and laterally spaced opposite sides, said rear board support has first and second sets of vertical ribs, with said vertical ribs being laterally spaced, with each vertical rib of said first set having a first groove of about the same thickness as said circuit board and spaced a first distance from said centerplane, and with each vertical rib of said second set having a second groove of about the same thickness as said circuit board and spaced a second distance from said centerplane which is greater than said first distance;

in a first type of IC card, the circuit board rear end has laterally-spaced slots that are wider than the ribs of said second set and that receive said ribs of said second set, while locations on said circuit board rear end are received in said first grooves;

in a second type of IC card, the circuit board rear end has laterally-spaced slots that are wider than the ribs of said first set, while locations on said circuit board rear end are received in said second grooves.

15. An IC card which includes a circuit board assembly having front and rear ends and a laterally-extending row of circuit board contact pads lying at least at said front end of said circuit board assembly, a front connector with at least one row of electrical contacts engaged with the row of contact pads at said board front end, and a sheet metal cover having upper and lower portions lying respectively over and under said circuit board, said cover having front and rear portions with said cover front portions coupled to said front connector, including:

a plastic molded rear end cap having at least one horizontal groove that closely receives said rear end of said circuit board assembly to fix the relative vertical position of said rear end of said circuit board assembly to said rear end cap, and said rear end cap having laterally opposite sides and having a latch leg projecting forwardly from each of said sides with each leg having a front end with a lug;

said circuit board assembly including a board having laterally opposite side edges that each forms a cutout that receives a corresponding one of said lugs, with each cutout forming a forwardly-facing cutout shoulder and with each lug forming a rearwardly-facing lug shoulder lying adjacent to a corresponding cutout shoulder, to prevent the circuit board assembly from moving forwardly out from said groove.

16. The IC card described in claim 15 wherein:

said sheet metal cover has opposite largely vertical sides (310);

each of said legs lies closely between a side edge of said circuit board and a vertical side of said sheet metal cover.

17. The IC card described in claim 15 wherein:

said latch legs are each devoid of a board-receiving groove of about the thickness of said circuit board, so said rearwardly-facing shoulder can engage circuit boards lying at different heights.

* * * * *